United States Patent [19]

Hoppe et al.

[11] Patent Number: 4,603,249

[45] Date of Patent: Jul. 29, 1986

[54] IDENTIFICATION CARD HAVING AN IC MODULE

[75] Inventors: Joachim Hoppe; Yahya Haghiri-Tehrani, both of Munich, Fed. Rep. of Germany

[73] Assignee: Gao Gesellschaft fur Automation und Organisation GmbH

[21] Appl. No.: 775,267

[22] Filed: Sep. 12, 1985

Related U.S. Application Data

[62] Division of Ser. No. 439,218, Nov. 4, 1982, Pat. No. 4,552,383.

[30] Foreign Application Priority Data

Dec. 24, 1981 [DE] Fed. Rep. of Germany ....... 3151408

[51] Int. Cl.[4] .......................................... G06K 19/06
[52] U.S. Cl. ..................... 235/492; 235/487
[58] Field of Search ................. 235/487, 492

[56] References Cited

U.S. PATENT DOCUMENTS

| | | | |
|---|---|---|---|
| 3,831,191 | 8/1974 | Ambrosio | 235/492 |
| 4,222,516 | 9/1980 | Badet et al. | |
| 4,417,413 | 11/1983 | Hoppe et al. | |

FOREIGN PATENT DOCUMENTS 2659573  7/1977  Fed. Rep. of Germany .

Primary Examiner—Harold I. Pitts
Attorney, Agent, or Firm—Sandler & Greenblum

[57] ABSTRACT

A multilayer identification card is equipped with an IC module. The module is arranged on a carrier element which is located in a recess in the multilayer card. The card layers bordering the recess bear supporting layers which are thermoresistant in the range of hot lamination temperatures. This prevents the recess from becoming filled with fluid card material during the hot laminating process, during which the card layers will soften and eventually become fluid. Thus, the IC module can advantageously give way within the recess when the card is bent. Further, the supporting layers have a stabilizing effect on the adjacent card layers and thereby prevent irregularities caused by incorporation of the carrier element from being passed onto the card surface. For these reasons, it is also possible to arrange the IC module or the carrier element which bears the module in the area of a magnetic stripe while preventing reading or writing processes from being disturbed by irregularities which would otherwise appear on the surface of the stripe.

4 Claims, 6 Drawing Figures

IDENTIFICATION CARD HAVING AN IC MODULE

This is a division of application Ser. No. 439,218 filed Nov. 4, 1982 now U.S. Pat. No. 455,238,3.

TECHNICAL FIELD OF THE INVENTION

The invention relates to a multilayer identification card or a similar data carrier having an IC module, the module being arranged on a carrier element and the identification card exhibiting a recess in the area of the carrier element.

DISCUSSION OF PRIOR ART

Identification cards with embedded IC modules known for some time. German Offenlegungsschrift No. 26 59 573 describes, for example, an identification card in which the IC module is arranged on a carrier plate and the carrier plate is glued or welded to the card at its edges. The IC module is arranged in the finished card in a recess (see FIG. 4).

The known identification card equipped with an IC module is not produced by the so-called "hot laminating" technique, which involves pressing the various card layers together and uniting them as a card compound in one operation using heat and pressure.

Cards produced by the hot laminating technique have many advantages due to their good appearance and the intimate connection of the various card layers which can be obtained by this technique and protects them from forgery. It is true that it is possible in principle to produce the card body itself of the identification card proposed by German Offenlegungsschrift No. 26 59 573 by the hot laminating technique. However, the incorporation of the carrier plate or the IC module in a prepared recess of the card body is carried out in a subsequent procedural step in order to protect the sensitive arrangement from heat and pressure, as explained in German Offenlegungsschrift No. 26 59 573. Such a procedure involves a production process which is uneconomical, especially for large quantities.

Summing up, in German Offenlegungsschrift No. 26 59 573 it is not considered advantageous to incorporate an IC module in an identification card during the production of the card by the hot laminating technique for the above-mentioned reasons. This type of card production, however, is not possible technically for the known card if the module is to be arranged in a recess remaining in the finished identification card. The recess is embossed in relief in the known card.

SUMMARY OF THE INVENTION

The problem of the invention thus consists in proposing an identification card which allows for the incorporation of an IC module arranged on a carrier element during the production of the card using the hot laminating technique, and which also exhibits a recess at least in the vicinity of the IC module even when it is completed.

The problem is solved according to the invention by the features stated in the characterizing part of the main claim.

The hot laminating technique makes it possible to transfer the advantages of this technique to identification cards with embedded IC modules. The recess provided to take up the IC module or carrier element is still present in the finished card due to the inherent stability of the card layers or films bordering on this recess. This recess allows the IC module, for example, room to move when the card is bent, thereby preventing premature destruction of the module or the leads joined to the module and increasing the useful life of the card.

The incorporation of an IC module in an identification card is basically a problem, because it involves embedding a "foreign body" in the laminate, leading to inhomogeneity in the structure of the card body. The IC module set in the hot-laminated identification card leaves uneven areas on the surface of the card. This is even more so when a recess is present in the module area. The uneven areas on the surface of the card caused by the IC module, the carrier element and the recess itself disturb the generally good appearance of hot-laminated identification cards. When the IC module is furthermore arranged in the area of the magnetic stripe, the uneven areas may even considerably interfere with the safe functioning of the stripe. The generally known ISO norm for identification cards prescribes very narrow limits for permissible irregularities in the surface of the magnetic stripe.

Irregularities in the surface of the card cannot be prevented by increasing the laminating pressure or changing the laminating temperature. However, it is been shown that a basic improvement, also with respect to the structure of the card surface, is achieved by equipping the identification card according to the invention. The supporting layers bordering on the recesses ensure that the unavoidable inhomogeneity inside the card is only transferred to the card surface to a small degree. For this reason it is also possible to arrange the IC module or the carrier element bearing the module in the vicinity of the magnetic stripe without disturbing reading or writing processes due to irregularities on the surface of the stripe.

The structure of the surface of the identification card can be further improved according to an advantageous development of the invention by providing several card films, each having a supporting layer, between the IC module or the carrier element and the film bearing the magnetic stripe.

The supporting layer arranged in the identification card according to the invention is made of a material which is thermoresistant in the range of the laminating temperature. It stabilizes the form of the card layers during the laminating process. For this purpose a screen printing ink may be used, for example, to produce the supporting layer. Silicone and teflon are also suitable as materials for the supporting layer. Basically any material may be used which remains thermoresistant and thus dimensionally stable during lamination.

BRIEF DESCRIPTION OF THE DRAWINGS

Further advantages and developments of the invention may be found in the sub-claims and the embodiments described in the following.

The drawings show.

DETAILED DESCRIPTION OF THE DRAWINGS

Figure 1:
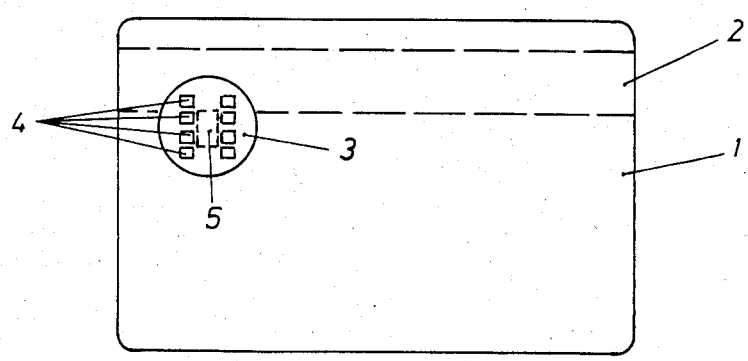
FIG. 1 an identification card with an IC module on a carrier element.

FIG. 1 shows an identification card 1 with an IC module 5. Module 5 is arranged on a carrier element 3, which shall be described in more detail below. The surface of the carrier element is provided with contact surfaces 4 which allow for communication with the IC module. The card bears a magnetic stripe 2 on the back.

In the arrangement of elements selected in FIG. 1, IC module 5 or carrier element 3 and magnetic stripe 2 are located in the same area of the card. This arrangement is advantageous when the card surface remaining under the magnetic stripe is to be reserved to its full extent for impressed characters.

Figure 2:
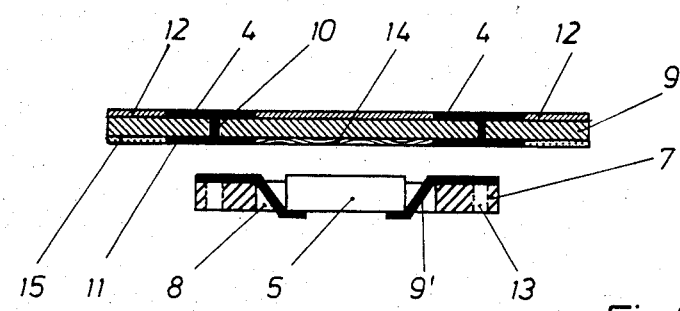
FIG. 2 the various elements of the carrier element used in the identification card in FIG. 1, FIG. 3 the various layers of the identification card including the compound carrier element in an unlaminated form, FIG. 4 the finished identification card with an IC module, FIG. 5 a finished identification card with several supporting layers, and FIG. 6 an identification card in which the entire carrier element is arranged in a recess.
Figure 3:
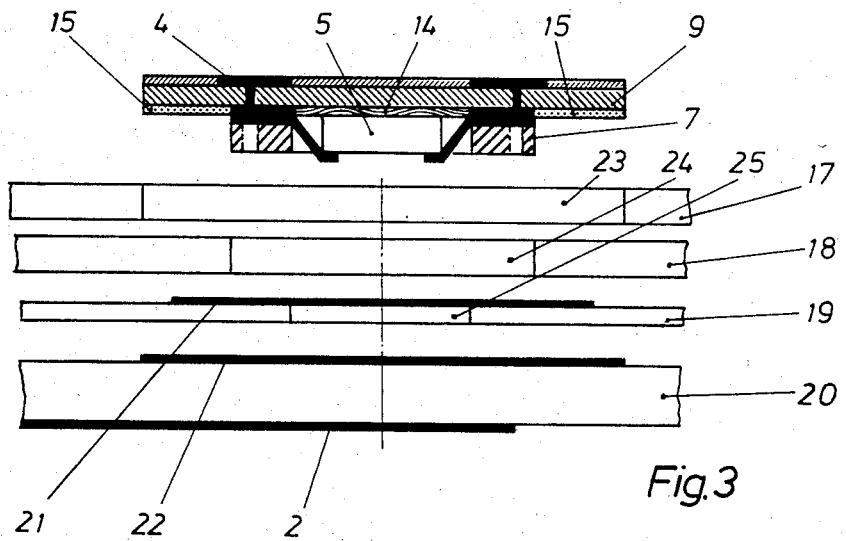

IC module 5 and contact surfaces 4 are part of a so-called carrier element 3, as shown in one embodiment in FIG. 2. The carrier element essentially comprises two films 9 and 7, which are shown separately from one another in FIG. 2 for the sake of clarity. IC module 5 is arranged in a window 8 of a first film 7 and connected here with leads 9'. The leads end on film 7. This way of contacting IC modules is known and is generally termed "tape automated bonding". The second film 9 bears the contact surfaces 4 necessary for communication with the module. These contact surfaces are connected by conductive channels 10 with further conductive surfaces 11 located on the opposite side of film 9 to contact surfaces 4. Film 9, which is made of flexible material, e.g. polyimide, partially bears a varnish layer 12 on the side on which contact surfaces 4 are located in order to make up for the thickness of the latter. The carrier element thus acquires an even surface which is on a plane with the card surface when the carrier element is incorporated in an identification card (see FIG. 4). For the production of the carrier element, films 7 and 9 are put together and leads 9' of film 7 are connected with conductive surfaces 11 of film 9, for example by a soldering process. For this purpose film 7 may be provided with recesses 13 in the area of its leads to allow for heat to be supplied to the soldering joint. The finished carrier element 3 is shown in FIG. 3. IC module 5 is connected with film 9 not only by the soldering joints but also by an appropriate adhesive 14. Since film 9 does not form a compound with the card materials conventionally used in the production of identification cards, a so-called "lamination adhesive" 15 is used, applied to the edges of film 9.

FIG. 3 shows, along with carrier element 3, the various layers of the unlaminated identification card. In this embodiment, the card is composed of layers 17, 18, 19 and 20. The first layer 17, which serves as the front cover layer of the card according to FIG. 1, is provided with a recess 23 which fits film 9 of the carrier element. The next layer 18 exhibits a recess 24 which fits film 7 of the carrier element. It is followed by layer 19 whose recess 25 fits the dimensions of IC module 5. The last layer is layer 20 which is equipped with a magnetic stripe 2, being the back cover film of the finished card. Card layers 19 and 20, according to the invention, each bear a supporting layer 21 and 22, respectively, the function of which shall be described with reference to FIG. 4.

Figure 4:
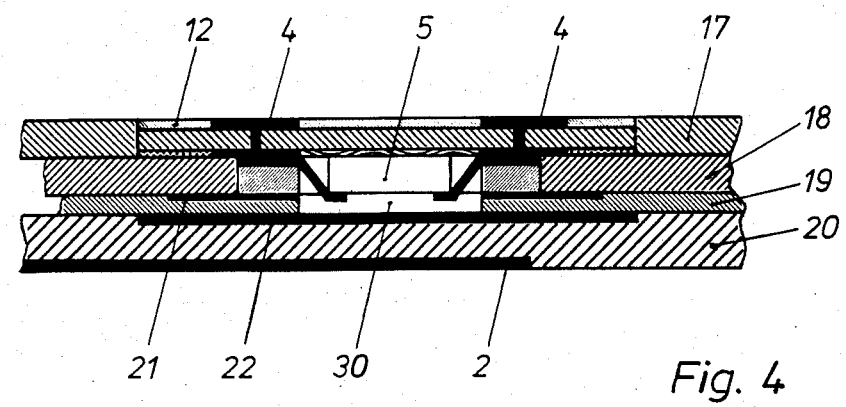

FIG. 4 shows a section of the finished, hot-laminated identification card.

IC module 5 is disposed in a recess 30 located approximately in the center of the identification card. Card layers 19 and 20 adjacent to this recess each bear a supporting layer 21, 22, as mentioned above. These supporting layers, which are thermoresistant in the laminating temperature range, have stabilized the form of layers 19, 20 during the hot laminating process, in which the card layers soften and finally become fluid, and have prevented the recess from being completely filled with card material. When the card is bent, as inevitably happens in the course of daily use, IC module 5 can give way, thus guaranteeing the functionability of the circuit for a long period of time.

The stabilizing effect of the supporting layers is connected with their property of preventing a compound of the card layers with each other. In the area of the supporting layers the card layers cannot fuse with each other and are thus selectively interrupted. This means that local irregularities caused by the embedded carrier element or the adjacent recess are interrupted before they are passed on to the surface of the card. The magnetic stripe 2 provided on the back of the card opposite carrier element 3 may be kept within the limits prescribed by the ISO norm, as far as the irregularities in its surface are concerned.

A screen printing ink (e.g. Wiedopan Superjet, J 65, black, of the Wiederhold Company), for example, is used to produce the supporting layer. It is also possible to provide a silicone or teflon layer on the appropriate card layers. The above-mentioned advantages may also be obtained by means of a very thin polyester film.

Figure 5:
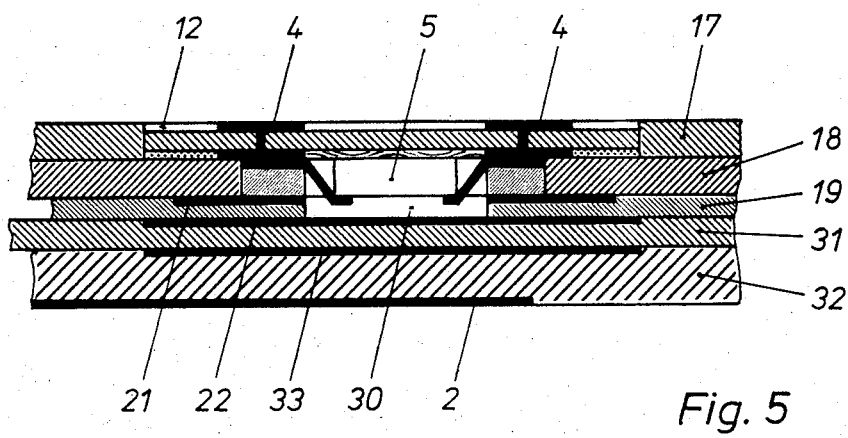

The structure of the card surface and thus also of the magnetic stripe may be further improved if, as in an advantageous development, the layer sequence shown in FIG. 5 is used for the production of identification cards with IC modules. In the identification card shown in FIG. 5, two films 31, 32 with an additional supporting layer 33 are provided instead of the back cover film 20 of FIG. 4. Thus the layer sequence of the identification card is interrupted again between the carrier element or the recess and the back cover film 32 bearing magnetic stripe 2.

It is almost impossible for irregularities to be passed on to the surface from inside the card due to the disconnection of the relevant layer areas which is provided in addition.

Figure 6:
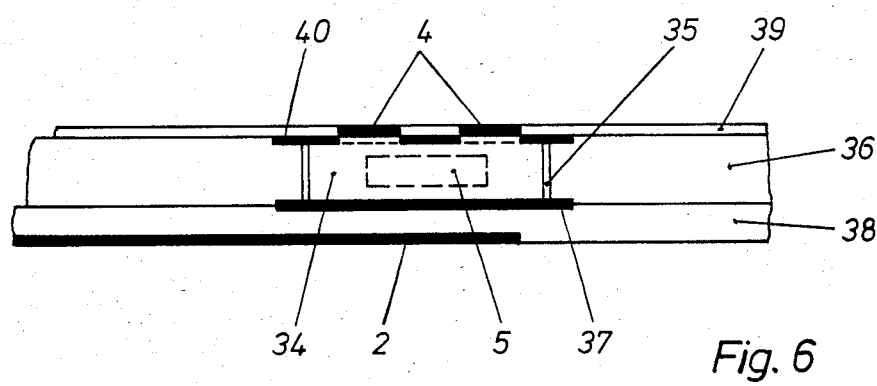

FIG. 6 shows a further embodiment of the inventive identification card in which not only IC module 5, but rather the entire carrier element 34 is arranged in a recess 35 in the card. The carrier element lies in a recess in the inner card layer 36. Supporting layer 37 is arranged in the area of the carrier element between inner card layer 36 and the back cover film 38 bearing magnetic stripe 2.

Furthermore, a further supporting layer 40 may be provided between inner card layer 36 and upper cover film 39, which exhibits corresponding recesses for contact surfaces 4. This is shown by a dotted line. The function of supporting layers 37, 40 is the same as was described with reference to the above embodiments.

We claim:

1. A carrier element for incorporating an IC module in an identification card, the IC module being arranged on the carrier element together with its leads and contact surfaces, characterized wherein the carrier element is composed of two films, a first film having a window bearing the IC module which is connected to leads ending on the film, and a second film bearing, on its front and back surfaces, conductive coatings which are connected with each other in an electrically conductive manner by the second film.

2. A carrier element as in claim 1, wherein the leads of the first film bearing the module are connected with the coatings on the back of the second film by a soldering process.

3. A carrier element as in claim 1, wherein the IC module is connected with the second film by an adhesive layer.

4. A carrier element as in claim 1, wherein the thickness of an exterior one of said conductive coatings is related to the thickness of a varnish layer on the second film.

* * * * *